United States Patent [19]
Glass et al.

[11] Patent Number: 5,834,953
[45] Date of Patent: Nov. 10, 1998

[54] HIGH SPEED CURRENT SENSE AMPLIFIER

[75] Inventors: Kevin W. Glass, Scottsdale, Ariz.; John R. Spence, Villa Park, Calif.; Lester J. Pastuszyn, Riverside, Calif.; William W. Decker, Huntington Beach, Calif.

[73] Assignee: Rockwell International Corporation, Newport Beach, Calif.

[21] Appl. No.: 756,203

[22] Filed: Nov. 25, 1996

[51] Int. Cl.⁶ .............................. G11C 7/06; G01R 19/00
[52] U.S. Cl. .................................................. 327/57; 327/55
[58] Field of Search .................................. 327/51, 52, 54, 327/55, 57, 103, 560–563

[56] References Cited

U.S. PATENT DOCUMENTS

| | | | |
|---|---|---|---|
| 4,247,791 | 1/1981 | Rovell | 327/55 |
| 4,253,163 | 2/1981 | Komoriya et al. | 327/57 |
| 4,255,679 | 3/1981 | White Jr. et al. | 327/57 |
| 5,274,275 | 12/1993 | Colles | 327/65 |
| 5,534,800 | 7/1996 | Hiraki et al. | 327/57 |
| 5,552,728 | 9/1996 | Lin | 327/51 |

*Primary Examiner*—Toan Tran
*Attorney, Agent, or Firm*—William C. Cray; Susie H. Oh

[57] ABSTRACT

A high speed current sense amplifier useful in memory devices, which includes a current-to-voltage amplifier that is coupled to a voltage amplifier. The current-to-voltage amplifier has an input impedance that is lower than its output impedance. The voltage amplifier has an input impedance that is larger than the input impedance of the current-to-voltage amplifier. The current sense amplifier can sense the current relationship between two current inputs in about 200 pico-seconds. Embodiments of the current sense amplifier enable current sensing either near the power supply voltage or near ground, thus eliminating the need for intermediate voltages. Embodiments of the current sense amplifier draw current from the current inputs only during the 200 pico-second sensing time and does not require external latching circuitry.

20 Claims, 11 Drawing Sheets

HIGH SPEED CURRENT SENSE AMPLIFIER

BACKGROUND OF THE INVENTION

This invention relates in general to integrated circuits. More particularly, this invention relates to a high speed current sense amplifier that is useful in rapidly determining the state of a memory device such as a SRAM.

SUMMARY OF THE INVENTION

The invention relates to a high speed current sense amplifier that is useful in memory devices. The current sense amplifier includes a current-to-voltage amplifier that is coupled to a voltage amplifier. The current-to-voltage amplifier has an input impedance that is lower than its output impedance. The voltage amplifier has an input impedance that is larger than the input impedance of the current-to-voltage amplifier. The current sense amplifier can sense the current relationship between two current inputs in about 200 pico-seconds. Embodiments of the current sense amplifier enable current sensing either near the power supply voltage or near ground, thus eliminating the need for intermediate voltages. Embodiments of the current sense amplifier draw current from the current inputs only during the 200 pico-second sensing time and does not require external latching circuitry.

DETAILED DESCRIPTION OF SPECIFIC EMBODIMENTS

Figure 1:
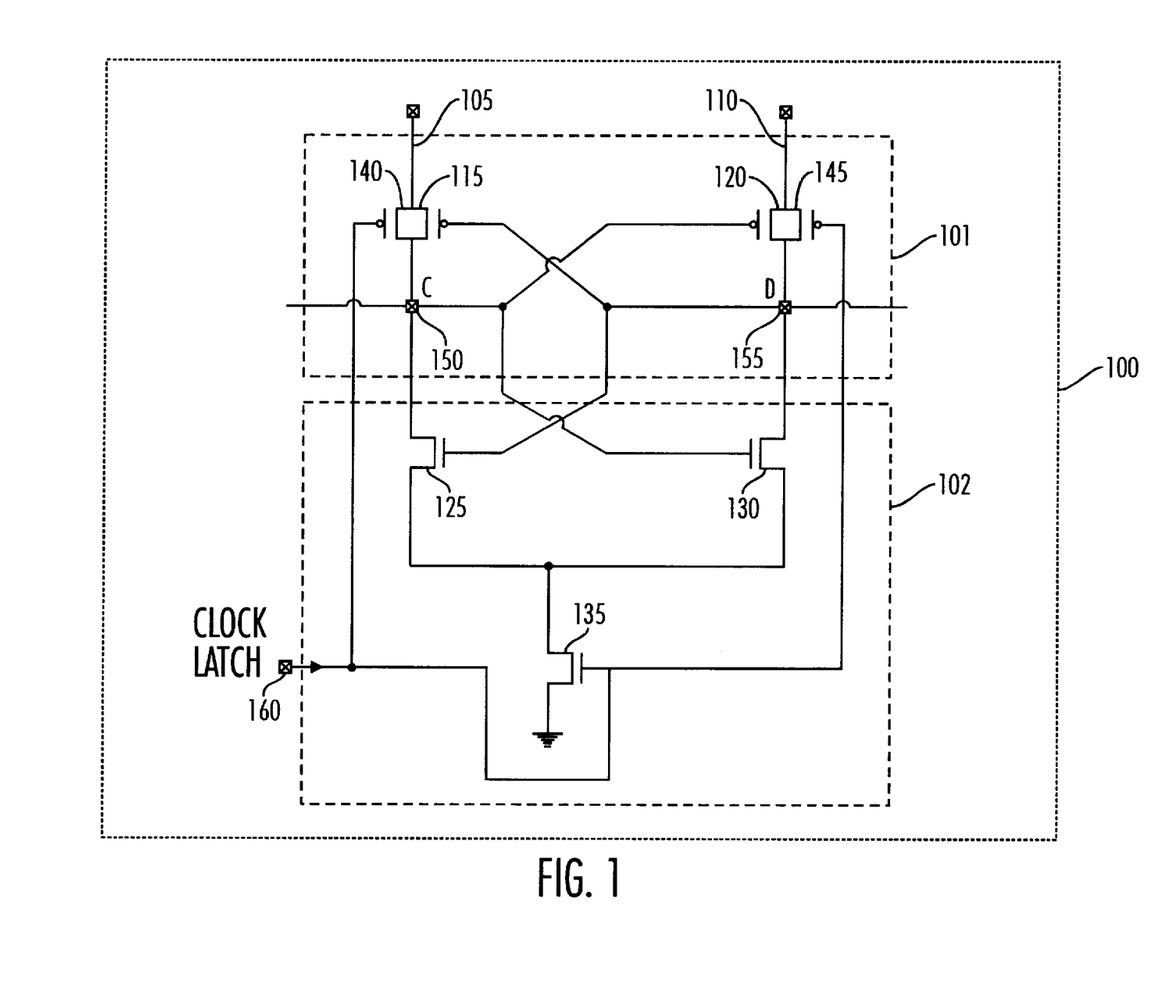
FIG. 1 is a circuit diagram of one embodiment of the current sense amplifier.

As shown in FIG. 1, the current sense amplifier 100 includes a current-to-voltage amplifier 101 and a voltage amplifier 102.

Circuit Description of the First Embodiment

Referring to FIG. 1, one embodiment of a current sense amplifier 100 is shown. This embodiment contains seven conventional field effect transistors ("FETs") 115, 120, 125, 130, 135, 140, and 145. As is well known in the art, a FET is a three terminal device consisting of a single junction embedded in a semiconductor. The three terminals are commonly known as a source, a drain, and a gate. Their functions are analogous to the emitter, collector, and base in a junction transistor. Thus, the gate provides the means to control the flow of charges between the source and drain. When the semiconductor sample of the FET is made of a n-type material, the FET is referred to as a n-channel device or NFET. On the other hand, when the semiconductor sample of the FET is made of a p-type material, the FET is referred to as a p-channel device or PFET.

Some of the FETs of the current sense amplifier 100 are complements of other FETs of the current sense amplifier 100. In this context, the term "complement" is used in the sense, commonly understood by those of ordinary skill in the art, to mean that the complement of a PFET is a NFET and vice versa. On the other hand, FETs of the same polarity are considered to be of the same "type." For example, one PFET is of the same type as another PFET. Similarly, a NFET is of the same type as another NFET. However, a NFET is not considered to be of the same type as a PFET.

As shown in FIG. 1, the first, second, sixth, and seventh FETs 115, 120, 140, and 145 are complements of the third, fourth, and fifth FETs 125, 130, and 135. In the embodiment shown in FIG. 1, which is useful in determining current relationships between voltages that are near to a power supply voltage, the first, second, sixth, and seventh FETs 115, 120, 140, and 145 are PFETs. Similarly, the third and fifth FETs 125, 130, and 135 are NFETs. Alternatively, if current relationships near ground need to be determined, the first, second, sixth, and seventh FETs 115, 120, 140, and 145 could be NFETs, and the third, fourth and fifth FETs 125, 130, and 135 could be PFETs.

The current sense amplifier 100 is configured to receive a first current input 105 and a second current input 110. The current inputs 105 and 110 may correspond to the output signals of a memory cell. This memory cell could be any conventional memory cell, such as, but not limited, to SRAM, DRAM, PROM, EPROM, EEPROM, or bubble memory cells.

The first current input 105 is fed to the source of a first FET 115. The drain of the first FET 115, shown as node C in FIG. 1, will be referred to as a first output 150. The second current input 110 is fed to the source of a second FET 120. The drain of the second FET 120, shown as node D in FIG. 1, will be referred to as a second output 155.

The gate of the first FET 115 is coupled to the gate of a third FET 125 and the drain of the second FET 120. The source of the third FET 125 is coupled to the drain of the first FET 115. Similarly, the gate of the second FET 120 is coupled to the gate of a fourth FET 130 and the drain of the first FET 115. The source of the fourth FET 130 is coupled to the drain of the second FET 120.

The source of the fifth FET 135 is coupled to the drain of the third and fourth FETs 125 and 130. The drain of the fifth FET 135 is coupled to ground.

The sixth FET 140 is configured in a "back-to-back" relationship with the first FET 115. In this context, the phrase "back-to-back" is used in the sense, commonly understood by those of ordinary skill, to mean sharing common sources and drains. Thus, the source of the sixth FET 140 is coupled to the source of the first FET 115. Similarly, the drain of the sixth FET 140 is coupled to the drain of the first FET 115. The gate of the sixth FET 140 is coupled to the gate of the fifth FET 135.

The seventh FET 145 is configured in a back-to-back relationship with the second FET 120. The gate of the seventh FET 145 is coupled to the gate of the fifth FET 135.

The gates of the fifth, sixth, and seventh FETs 135, 140, and 145 are also coupled to a clock latch line 160. This clock latch line 160 is used to initiate current sensing.

The impedance between the current inputs 105 and 110 is known as the input impedance of the current-to-voltage amplifier 101. Similarly, the impedance between the first and second outputs 150 and 155 is known as the output impedance of the current-to-voltage amplifier 101. The input impedance of the current-to-voltage amplifier 101 is lower than the output impedance of the current-to-voltage amplifier 101.

The term impedance, which is understood by those skilled in the art, means the total opposition offered to the flow of an alternating or pulsating current. In other words, impedance is the vector sum of the resistance and the capacitive and inductive reactance. Thus, as understood by those skilled in the art, impedance is the ratio of voltage to current. Impedance is typically measured in ohms.

The voltage amplifier 102 has an input impedance which is equal to the output impedance of the current-to-voltage amplifier 101. Thus, input impedance of the voltage amplifier 102 is greater than the input impedance of the current-to-voltage amplifier 101.

Description of the Method of Operation of the First Embodiment

The current sense amplifier 100 can rapidly detect the sense of the differential current between the first and second current input lines 105 and 110. For example, assume the first current input line 105 is at 2.9 volts and the second current input line 110 is at 3.0 volts.

Initially, clock latch line 160 is "low." Recall that the first FET 115 is a complement of the third FET 125. Thus, the fifth FET 135 will initially be "off" and the sixth and seventh FETs 140 and 145 will initially be "on." Because the seventh FET 145 is "on," 3.0 volts will be applied to the gate of both the first and third FETs 115 and 125. Therefore, the first FET 115 will be "off" and the third FET 125 will be "on." Similarly, because the sixth FET 140 is also "on," 2.9 volts will be applied to the gate of both the second and fourth FETs 120 and 130. Therefore, the second FET 120 will be "off" and the fourth FET 130 will be "on."

At this time, the voltage on FET 130 is lower than the voltage on FET 125. As a result, the drain current on FET 130 will be less than the drain current on FET 125. This current difference has two beneficial results. First, it speeds the evaluation of the sense amplifier by preconditioning it to switch to the proper state when the clock latch line 160 goes "high." Second, the current difference helps to override any mismatches between FET 125 and FET 130 that may be present in any production sense amplifier. Thus, the input sensitivity of the sense amp is improved.

Figure 2:
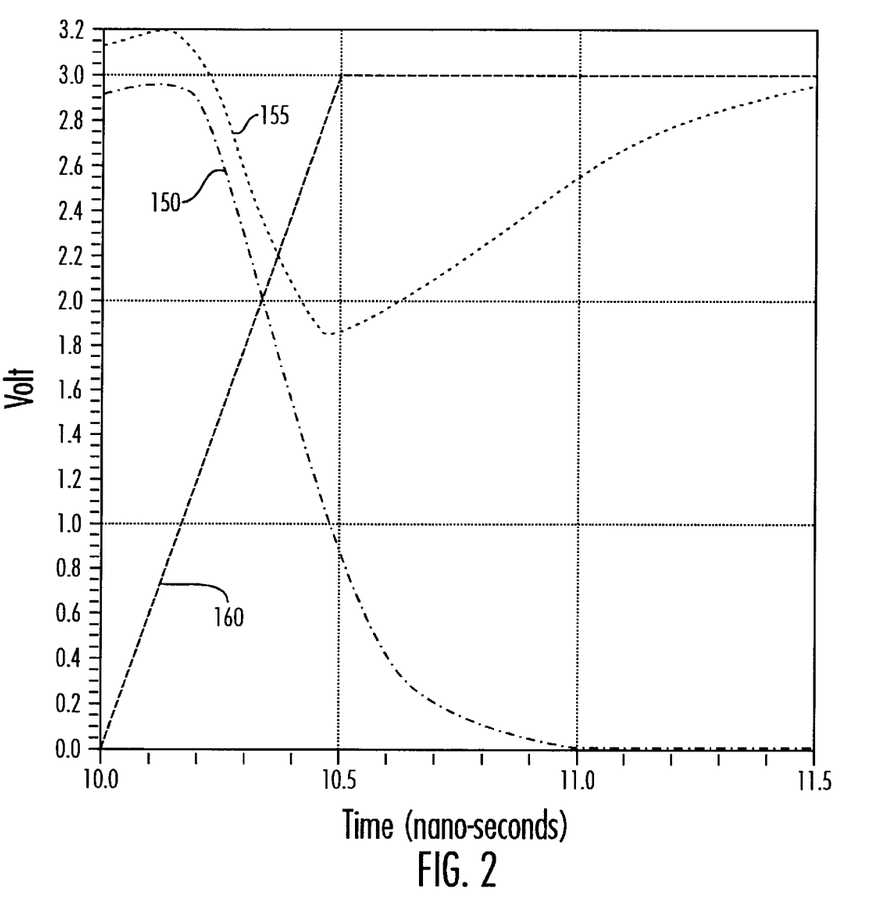
FIG. 2 is a timing diagram of various signals of the current sense amplifier of FIG. 1.

Referring to FIG. 2, when the clock latch line 160 goes "high" it turns the fifth FET 135 "on" and turns the sixth and seventh FETs 140 and 145 "off." Thus, the voltages at the first output 150 and the second output 155 begin to decrease. However, because the voltage applied to the gate of the third FET 125 is greater than the voltage applied to the gate of the fourth FET 130, the third FET 125 draws more current that the fourth FET 130.

As shown in FIG. 2, initially, the voltage differential between the voltages at the first output 150 and the second output 155 remains approximately constant. However, as the first output 150 and the second output 155 continue to lower, the first output 150 will lower at a faster rate than the second output 155. Again, this occurs because the third FET 125 is drawing more current than the fourth FET 130. When the first output 150 lowers below the activation voltage of the second FET 120, the second FET 120 will turn "on." When the second FET 120 turns "on," the voltage at the second output 155 begins to rise. Thus, the voltage at the second output 155 never lowers below the activation voltage of the first FET 115 and the first FET 115 remains "off." As a result, the first output 150 continues lowering to ground.

At this tire, the first FET 115 is "off" and the third FET 125 is "on." Thus, no current is being drawn from the first current input 105. Similarly, the second FET 120 is "on" and the fourth FET 130 is "off." Thus, no current is being drawn from the second current input 110.

Circuit Description of the Second Embodiment

Figure 3:
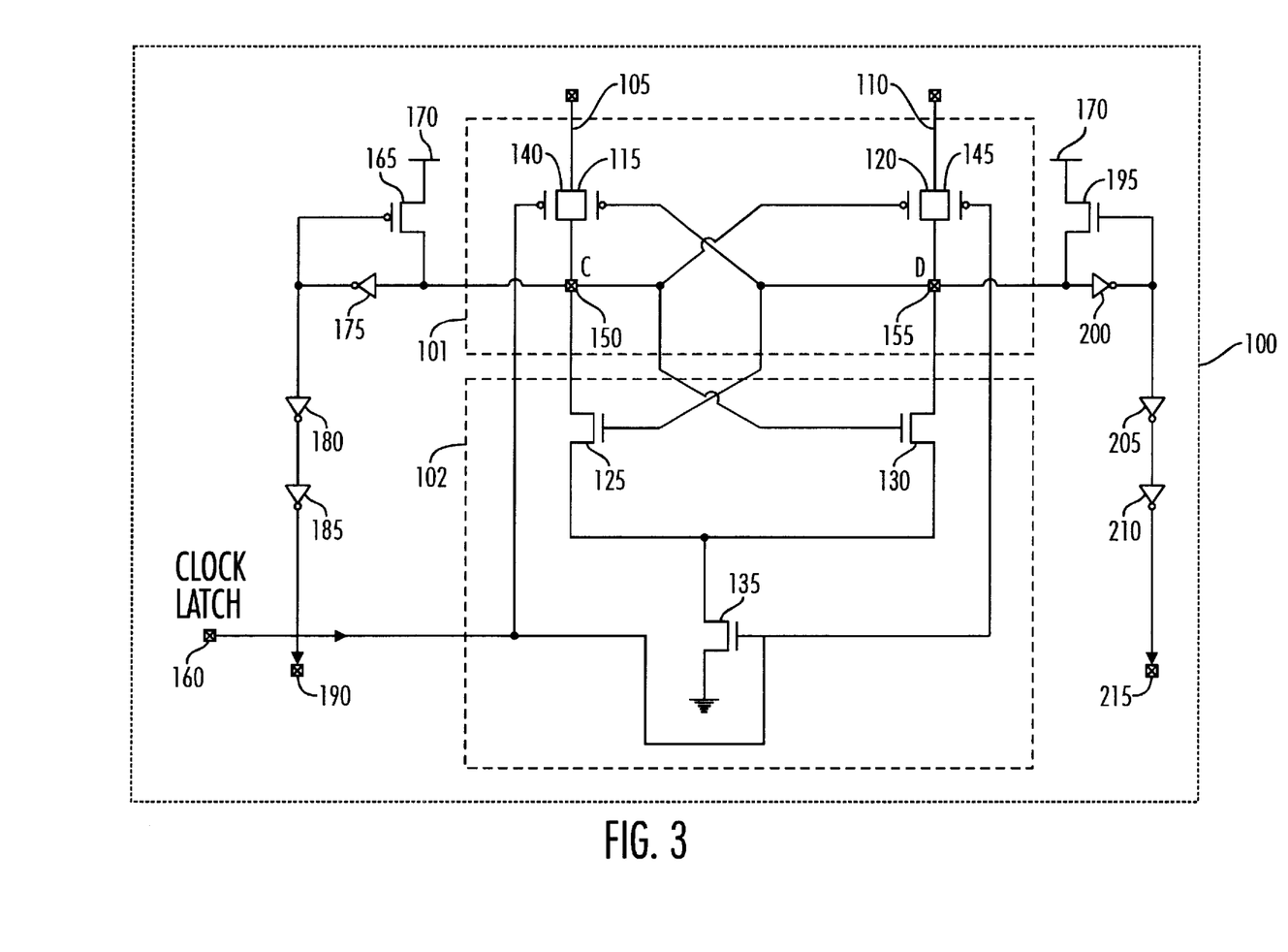
FIG. 3 is a circuit diagram of a second embodiment of the current sense amplifier.

Referring to FIG. 3, a second embodiment of the sense amplifier 100 is presented. In this embodiment the source of an eighth FET 165 is coupled to a voltage power supply 170. The drain of the eighth FET 165 is coupled to the first output 150 and to the input of a first inverter 175. The output of the first inverter 175 is coupled to the gate of the eighth FET 165 and to the input of a second inverter 180. The output of the second inverter 180 is coupled to the input of a third inverter 185. The output of the third inverter 185 is a buffered output that corresponds to the first output 150. This output will be referred to as a first buffered output 190.

Again referring to FIG. 3, the source of a ninth FET 195 is coupled to the voltage power supply 170. The drain of the ninth FET 195 is coupled to the second output 155 and to the input of a fourth inverter 200. The output of the fourth inverter 200 is coupled to the gate of the ninth FET 195 and to the input of a fifth inverter 205. The output of the fifth inverter 205 is coupled to the input of a sixth inverter 210. The output of the sixth inverter 210 is a buffered output that corresponds to the second output 155. This output will be referred to as a second buffered output 215.

As a result of circuit simulations, it has been found that certain channel widths and channel lengths for the FETs in the sense amplifier 100 may be optimal. These widths and lengths are shown below.

| Field Effect Transistor | Channel Width ($\mu$m) | Channel Length ($\mu$m) |
| --- | --- | --- |
| First FET 115 | 3.30 | 1.00 |
| Second FET 120 | 3.30 | 1.00 |
| Third FET 125 | 9.60 | 1.00 |
| Fourth FET 130 | 9.60 | 1.00 |
| Fifth FET 135 | 13.1 | 0.50 |
| Sixth FET 140 | 4.00 | 0.50 |
| Seventh FET 145 | 4.00 | 0.50 |
| Eighth FET 165 | 1.20 | 1.90 |
| Ninth FET 195 | 1.20 | 1.90 |

Description of the Method of Operation of the Second Embodiment

Recall that initially, the first output 150 is at 2.9 volts. Thus, the eighth FET 165 is initially "on." Referring to FIG. 3, when the clock latch line 160 initially goes "high," a voltage divider exists between the eighth FET 165, which is coupled to the power supply 170, and the third FET 125, which is coupled to ground. When the first output 150 lowers below the trigger point of the first inverter 175, the output of the first inverter 175 turns the eighth FET 165 "off." Thus, the first output 150 is allowed to lower to ground. Then, in order to reduce any signal deviations, the output from the first inverter 175 then passes through the second inverter 180 and the third inverter 185 to form a first buffered output 190.

Recall that the second output 155 does not continue to lower as does the first output 150, but it reverses and begins to increase toward 2.9 volts. Because this reversal occurs before the voltage at the second output 155 reaches the trigger point of the fourth inverter 200, the fourth inverter 200 never toggles. Thus, the ninth FET 195 remains "on" and provides a "pull-up" so that the second output 155 is latched. In order to reduce any signal deviations, this latched output is then passed through the fifth inverter 205 and the sixth inverter 210 to form a second buffered output.

Additional Alternative Embodiments

There are many alternative embodiments of the previously described current-to-voltage amplifier 101 and voltage amplifier 102. Each of the alternative embodiments operate in a manner similar to the previously described embodiments and may be incorporated into memory devices.

Figure 5:
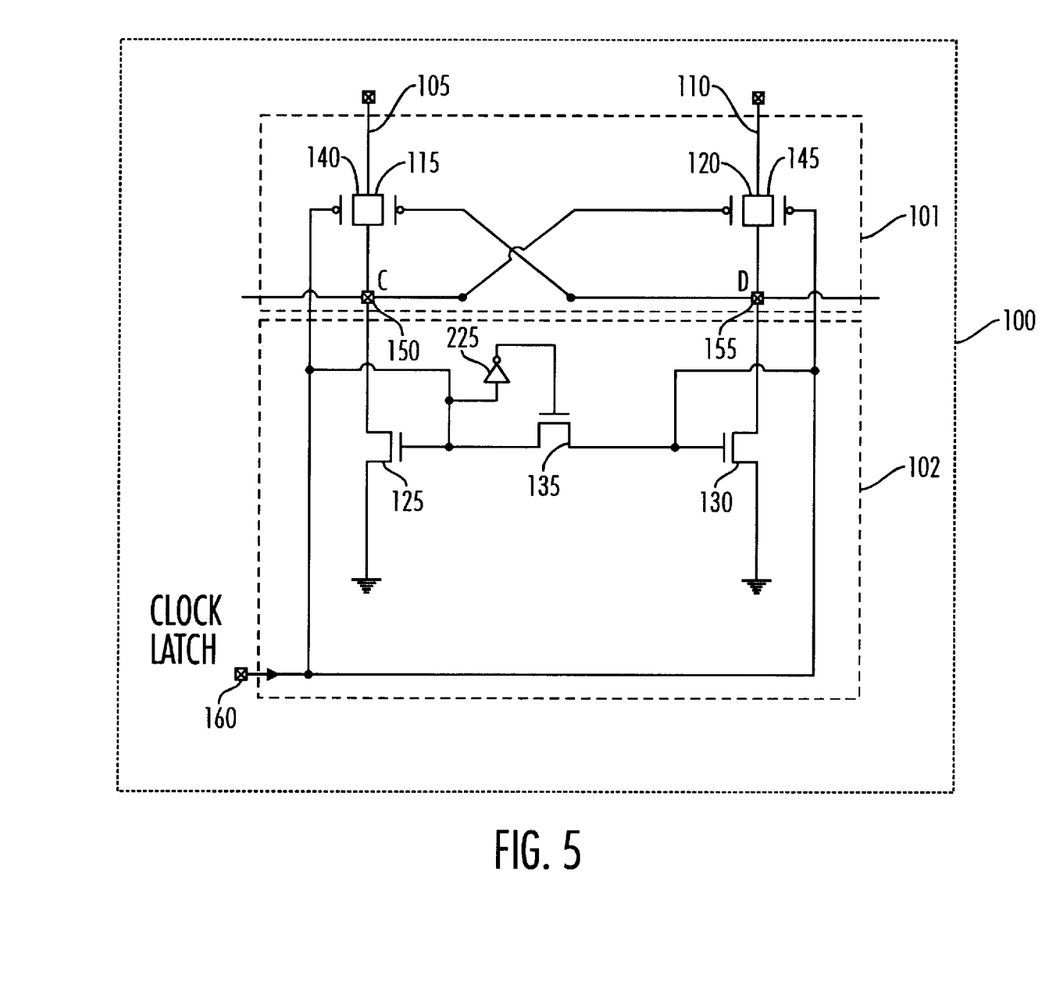
FIG. 5 is a diagram of a third embodiment of the current sense amplifier.

A third embodiment of the current sense amplifier 100 is shown in FIG. 5. This embodiment is similar to the embodiment shown in FIG. 1. However, the gates of the third and fourth FETs 125 and 130 are coupled to the clock latch line 160. In addition, the gate of the third FET 125 is coupled to an inverter 225 and to the source of the fifth FET 135. The output of inverter 225 is coupled to the gate of the fifth FET 135. The gate of the fourth FET 130 is also connected to the drain of the fifth FET 135.

Figure 6:
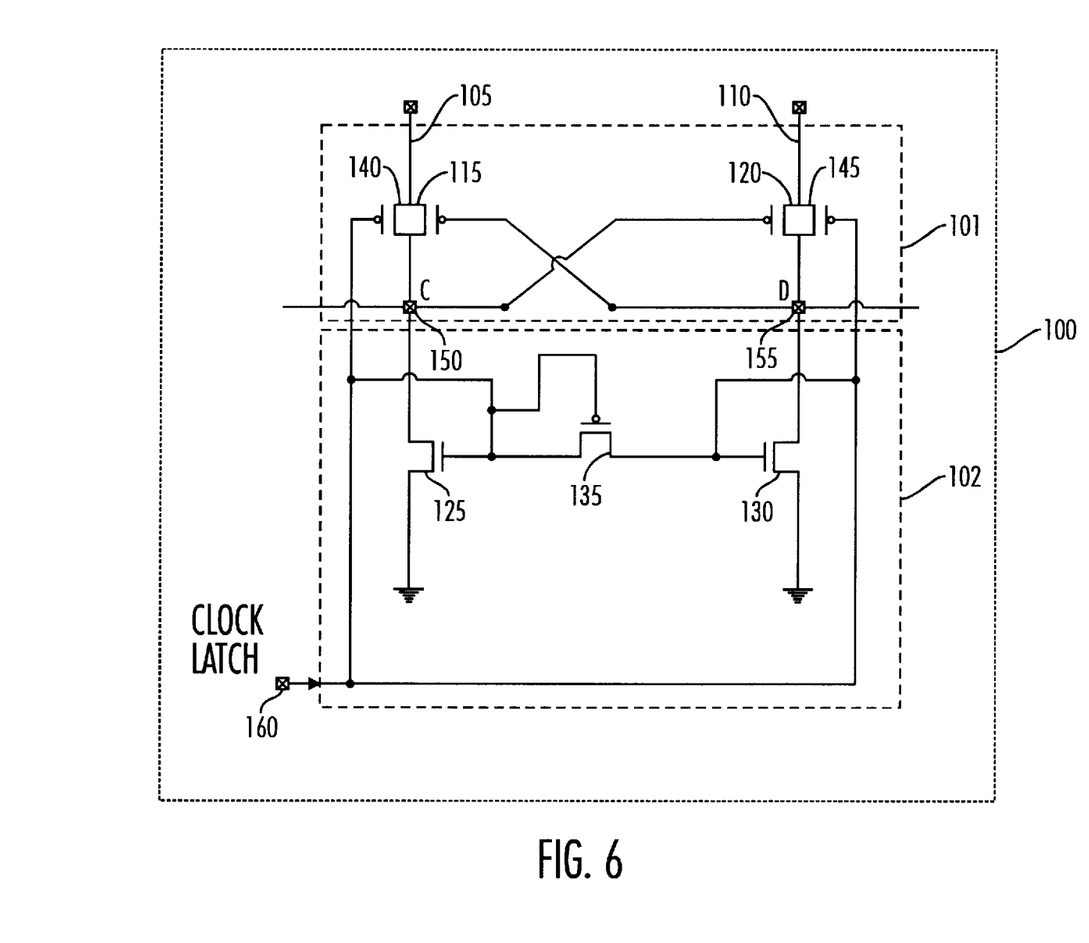
FIG. 6 is a diagram of a fourth embodiment of the current sense amplifier.

A fourth embodiment of the current sense amplifier 100 is shown in FIG. 6. This embodiment is similar to the embodiment shown in FIG. 5. However, the fifth FET 135 is replaced with a PFET and the inverter 225 is omitted.

Figure 7:
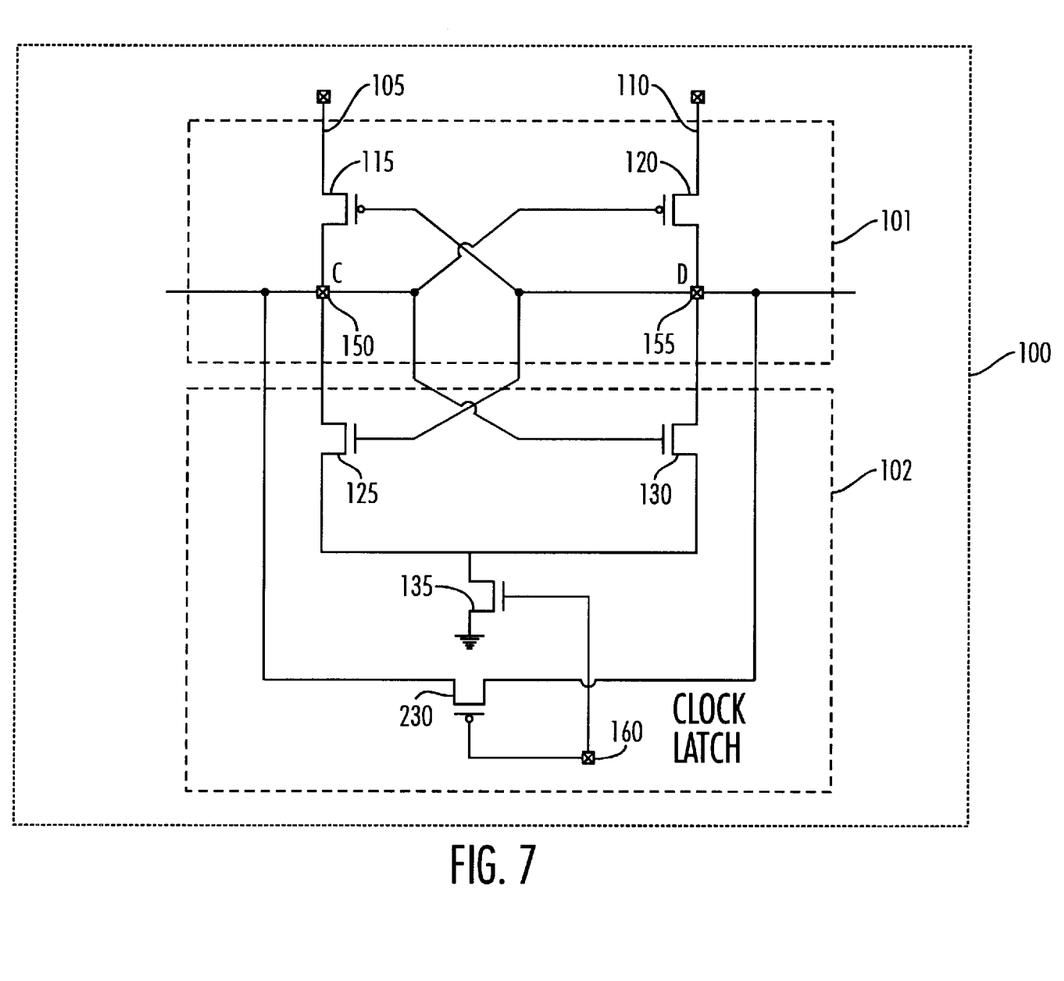
FIG. 7 is a diagram of a fifth embodiment of the current sense amplifier.

FIG. 7 shows a current sense amplifier 100 that may minimize die space. In this fifth embodiment, which is similar to the current sense amplifier 100 shown in FIG. 1, the sixth and seventh FETs 140 and 145 are omitted. However, an additional FET 230 is added. The source of the additional FET 230 is coupled to the first output 150 and the drain of the additional FET 230 is coupled to the second output 155. Finally, the gate of the additional FET 230 is coupled to the clock latch line 160.

Figure 8:
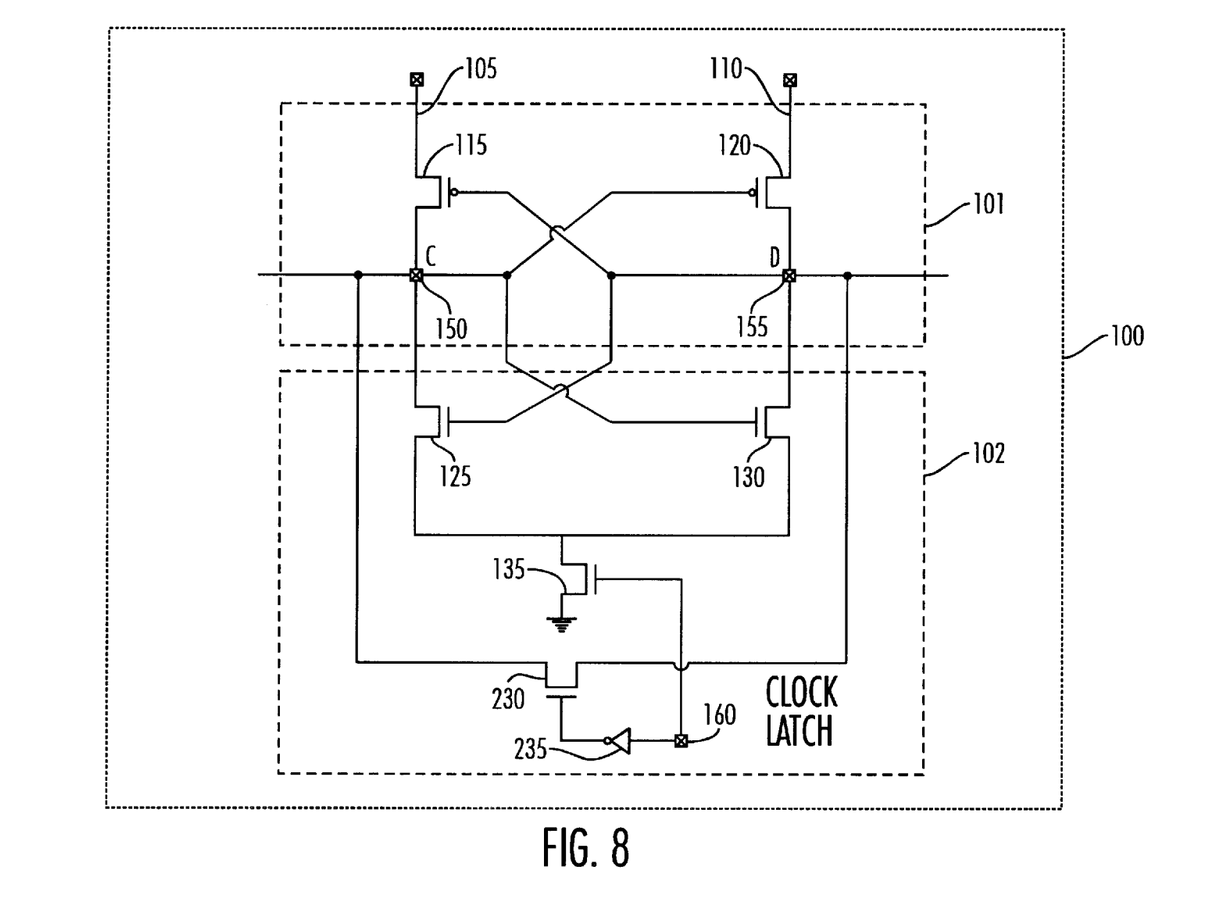
FIG. 8 is a diagram of a sixth embodiment of the current sense amplifier.

A sixth embodiment of the current sense amplifier 100 is shown in FIG. 8. This embodiment is similar to the embodiment shown in FIG. 7. However, the additional FET 230 is complemented. In addition, an inverter 225 is placed between the clock latch line 160 and the gate of the additional FET 230.

Figure 9:
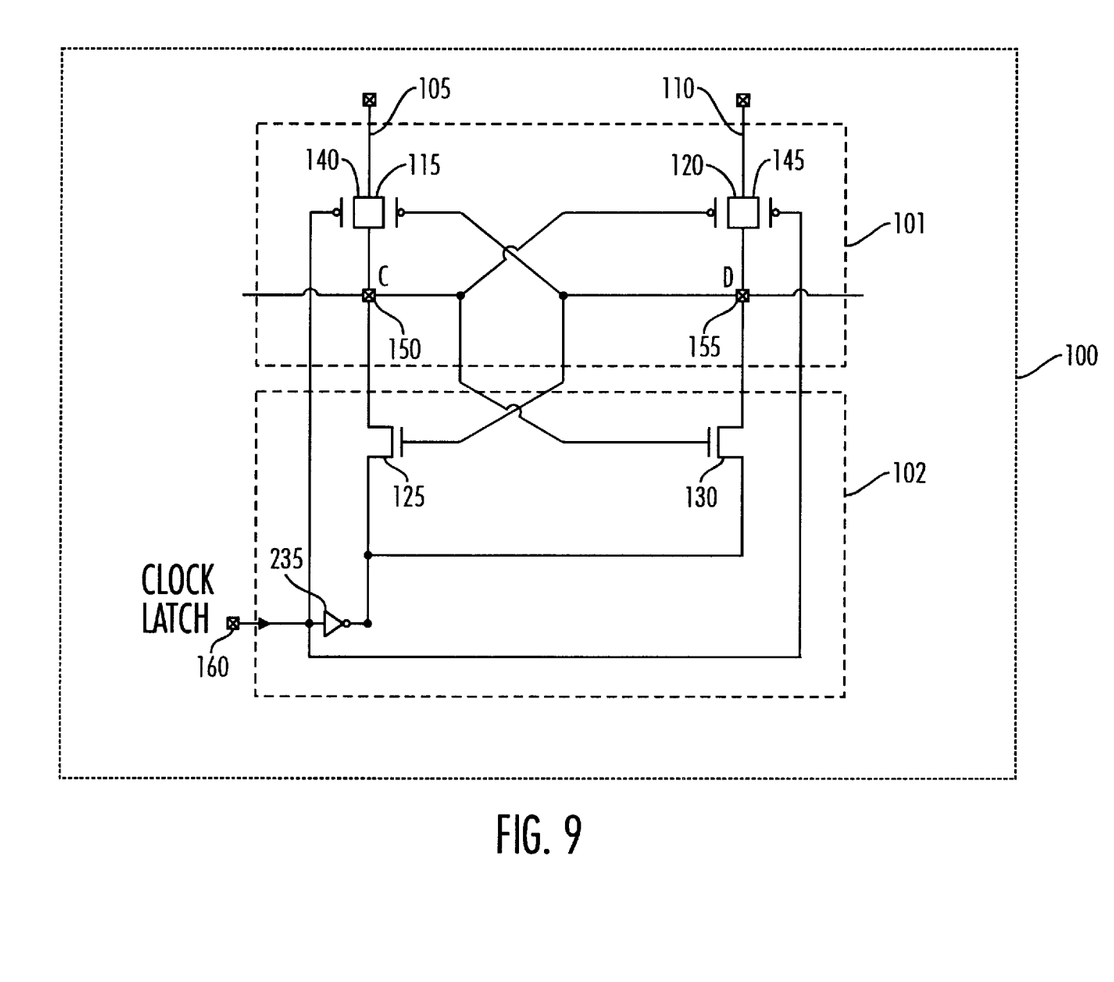
FIG. 9 is a diagram of a seventh embodiment of the current sense amplifier.

A seventh embodiment of the current sense amplifier 100 is shown in FIG. 9. This embodiment is similar to the embodiment shown in FIG. 1. However, the fifth FET 135 is omitted. In addition, an inverter is placed between the clock latch line 160 and the drains of the third and fourth FETs 125 and 130.

Figure 10:
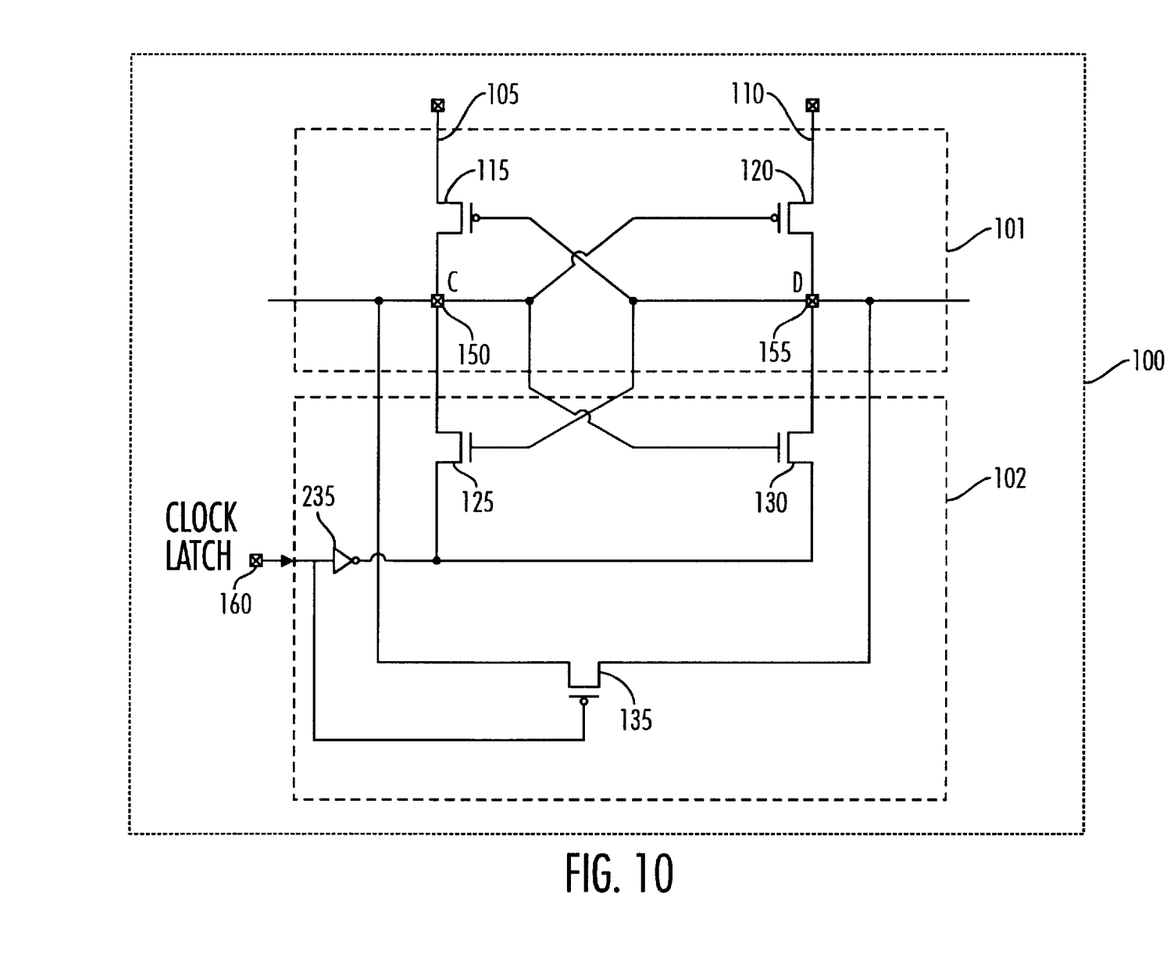
FIG. 10 is a diagram of an eighth embodiment of the current sense amplifier.

An eighth embodiment of the current sense amplifier 100 is shown in FIG. 10. This embodiment is similar to the embodiment shown in FIG. 7. However, the source of the fifth FET 135 is coupled to the first output and the drain of the fifth FET 135 is coupled to the second output. In addition, an inverter 235 is placed between the clock latch line 160 and the drains of the third and fourth FETs 125 and 130.

Figure 11:
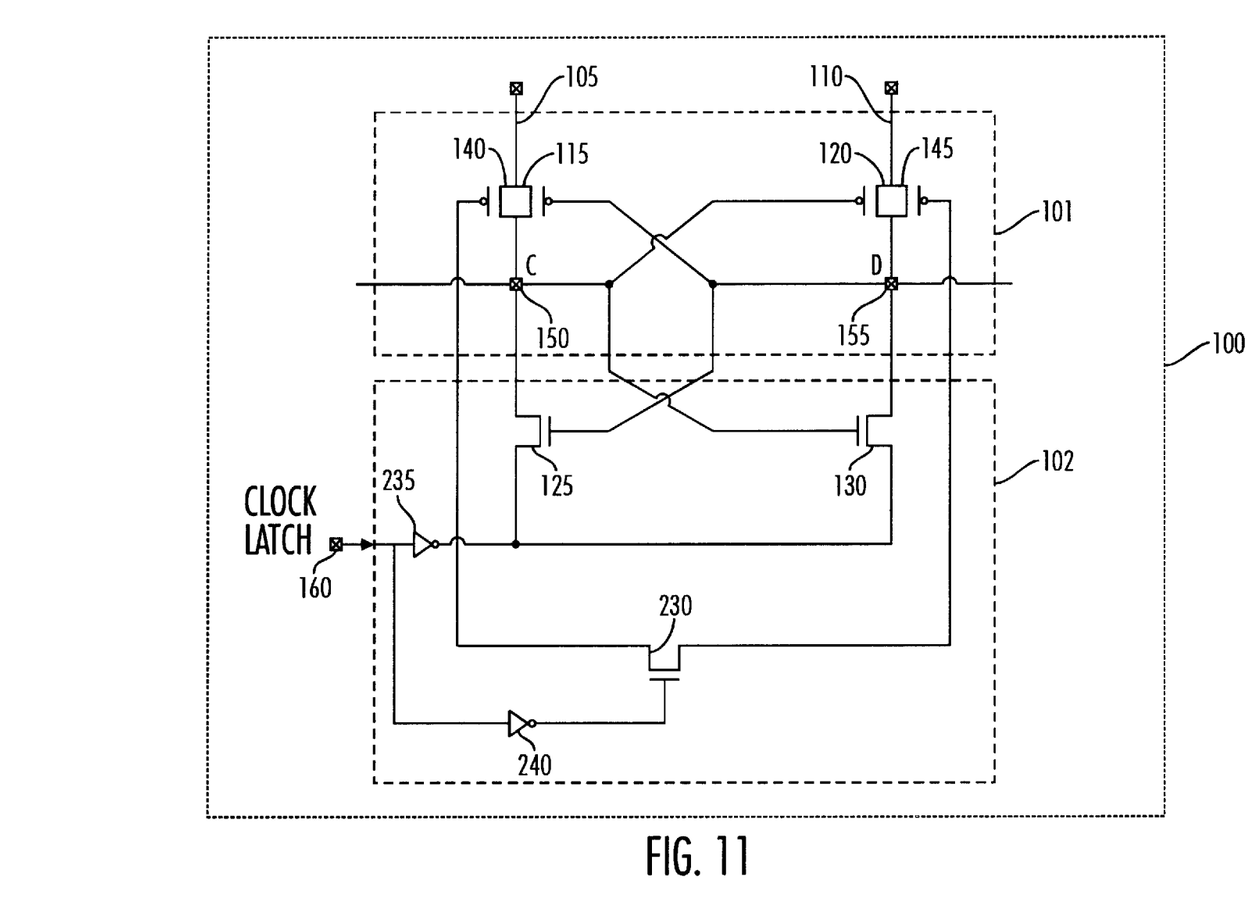
FIG. 11 is a diagram of a ninth embodiment of the current sense amplifier.

A final embodiment of the current sense amplifier 100 is shown in FIG. 11. This embodiment is similar to the embodiment shown in FIG. 10. However, the additional FET 230 is a NFET. In addition, an additional inverter 240 is placed between the clock latch line 160 and the drains of the third and fourth FETs 125 and 130.

Remarks

Figure 4:
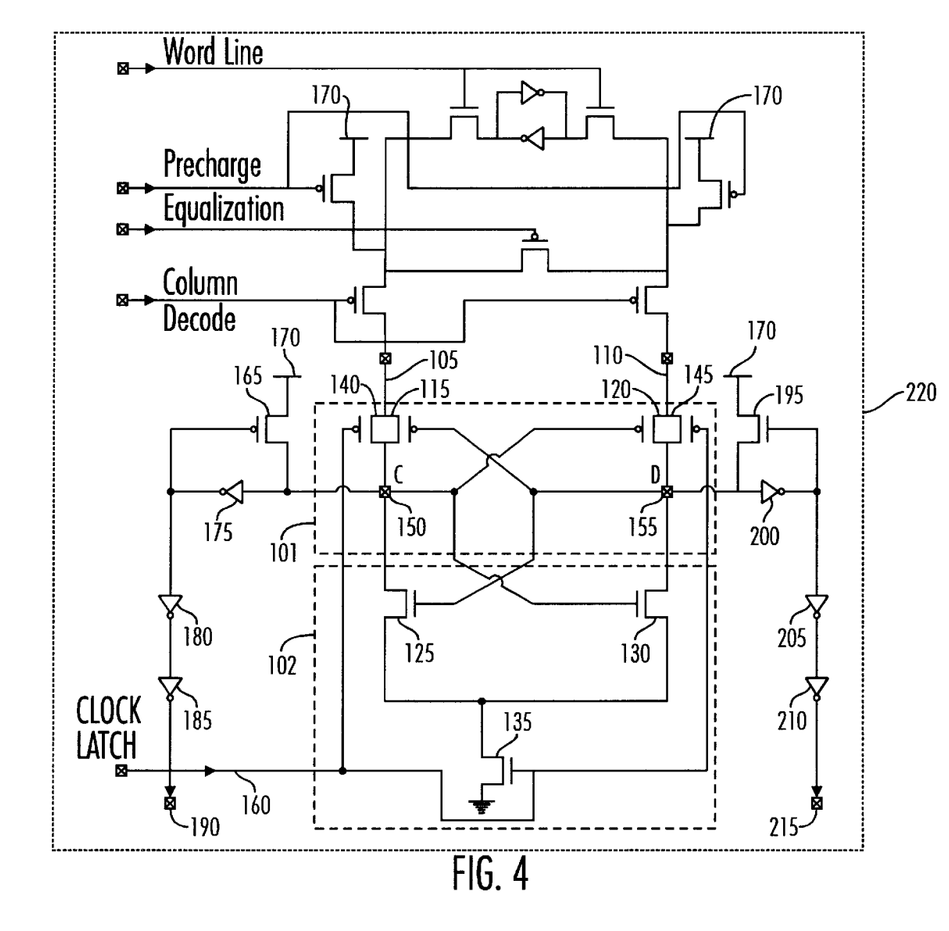
FIG. 4 is a diagram of a SRAM memory device including the second embodiment of the current sense amplifier.

One of the primary advantages of the circuits described above is that they sense current relationships very rapidly. In fact, current relationships can be sensed in about 200 pico-seconds. Thus, the current sense amplifier output is available to other circuitry very quickly and a memory device, such as the SRAM memory device 220 shown in FIG. 4, can have a very fast access time. Using this approach, memories having internal access times of less than 2 nano-seconds have been attained.

Another advantage is that the current sense amplifier output can be latched without the need for an external latching circuit. Thus, die space is conserved.

Still another advantage is that current determinations may be made near the power supply voltage. Alternatively, by complementing the FETs shown in FIGS. 1 and 3, voltages may be sensed near ground. Thus, the need for intermediate voltages is reduced or eliminated.

A further advantage is that current is drawn from the current inputs only during sensing. Thus, before and after the 200 pico-second sensing time, little or no current is drawn.

While specific embodiments are described above, it will be apparent to those of ordinary skill having the benefit of this disclosure that other modifications and changes therein in addition to the examples discussed above may be made by those skilled in the art without departing from the spirit and scope of the invention.

What is claimed is:

1. A current sense amplifier comprising:
   a first FET, the source of the first FET being coupled to a first current input, the drain of the first FET being referred to as a first output;
   a second FET, the source of the second FET being coupled to a second current input, the drain of the second FET being referred to as a second output;
   a third FET, the gate of the third FET being coupled to the gate of the first FET, the source of the third FET being coupled to the drain of the first FET, the gate of the third FET being coupled to the drain of the second FET;
   a fourth FET, the gate of the fourth FET being coupled to the gate of the second FET, the source of the fourth FET being coupled to the drain of the second FET, the gate of the fourth FET being coupled to the drain of the first FET;
   a fifth FET, the source of the fifth FET being coupled to the drain of the third and fourth FETs, the drain of the fifth FET being coupled to ground;
   a sixth FET, the source of the sixth FET being coupled to the source of the first FET, the drain of the sixth FET being coupled to the drain of the first FET, the gate of the sixth FET being coupled to the gate of the fifth FET;
   a seventh FET, the source of the seventh FET being coupled to the source of the second FET, the drain of the seventh FET being coupled to the drain of the second FET, the gate of the seventh FET being coupled to the gate of the fifth FET; and
   wherein the first, second, sixth, and seventh FETs are complements of the third, fourth, and fifth FETs.

2. The current sense amplifier of claim 1 further comprising:
   an eighth FET, the source of the eighth FET being coupled to a voltage power supply, the drain of the eighth FET being coupled to the first output;

a first inverter, the input of the first inverter being coupled to the drain of the eighth FET, the output of the first inverter being coupled to the gate of the eighth FET;

a second inverter, the input of the second inverter being coupled to the output of the first inverter;

a third inverter, the input of the third inverter being coupled to the output of the second inverter, the output of the third inverter being referred to as a first buffered output;

a ninth FET, the source of the ninth FET being coupled to a voltage power supply, the drain of the ninth FET being coupled to the second output;

a fourth inverter, the input of the fourth inverter being coupled to the drain of the ninth FET, the output of the fourth inverter being coupled to the gate of the ninth FET;

a fifth inverter, the input of the fifth inverter being coupled to the output of the fourth inverter;

a sixth inverter, the input of the sixth inverter being coupled to the output of the fifth inverter, the output of the sixth inverter being referred to as a second buffered output; and wherein the sixth, seventh, eight, and ninth FETs are of the same type.

3. The current sense amplifier of claim 2, wherein the sixth FET is a PFET.

4. The current sense amplifier of claim 2, wherein the sixth FET is a NFET.

5. The current sense amplifier of claim 2, wherein:

the eighth FET has higher impedance than the third FET; and the ninth FET has higher impedance than the fourth FET.

6. The current sense amplifier of claim 2 wherein:

the eighth FET has higher impedance than the first FET; and the ninth FET has higher impedance than the second FET.

7. The current sense amplifier of claim 2 wherein the eighth and ninth FETs all have higher impedances than any of the first, second, third, and fourth FETs.

8. The current sense amplifier of claim 1, wherein the current sense amplifier is included in a memory device.

9. The current sense amplifier of claim 1, wherein the current sense amplifier is included in a SRAM.

10. The current sense amplifier of claim 2, wherein the current sense amplifier is included in a memory device.

11. The current sense amplifier of claim 2, wherein the current sense amplifier is included in a SRAM.

12. A current sense amplifier comprising:

a first FET, the source of the first FET being coupled to a first current input, the drain of the first FET being referred to as a first output;

a second FET, the source of the second FET being coupled to a second current input, the drain of the second FET being referred to as a second output;

a third FET, the source of the third FET being coupled to the drain of the first FET, the drain of the third FET being coupled to ground;

a fourth FET, the source of the fourth FET being coupled to the drain of the second FET, the drain of the fourth FET being coupled to ground;

a fifth FET, the source of the fifth FET being coupled to the gate of the third FET, the drain of the fifth FET being coupled to the gate of the fourth FET;

a sixth FET, the source of the sixth FET being coupled to the source of the first FET, the drain of the sixth FET being coupled to the drain of the first FET, the gate of the sixth FET being coupled to the gate of the third FET; and a seventh FET, the source of the seventh FET being coupled to the source of the second FET, the drain of the seventh FET being coupled to the drain of the second FET, the gate of the seventh FET being coupled to the gate of the fourth FET.

13. The current sense amplifier of claim 12 further comprising:

an inverter, the input of the inverter being coupled to the gate of the third FET, the output of the inverter being coupled to the gate of the fifth FET; and wherein the first, second, sixth, and seventh FETs are complements of the third, fourth, and fifth FETs.

14. The current sense amplifier of claim 12, wherein the first, second, fifth, sixth, and seventh FETs are complements of the third and fourth FETs.

15. A current sense amplifier comprising:

a first FET, the source of the first FET being coupled to a first current input, the drain of the first FET being referred to as a first output;

a second FET, the source of the second FET being coupled to a second current input, the drain of the second FET being referred to as a second output;

a third FET, the gate of the third FET being coupled to the gate of the first FET, the source of the third FET being coupled to the drain of the first FET, the gate of the third FET being coupled to the drain of the second FET;

a fourth FET, the gate of the fourth FET being coupled to the gate of the second FET, the source of the fourth FET being coupled to the drain of the second FET, the gate of the fourth FET being coupled to the drain of the first FET;

a fifth FET, the source of the fifth FET being coupled to the drain of the third and fourth FETs, the drain of the fifth FET being coupled to ground;

an additional FET, the source of the additional FET being coupled to the first output, the drain of the additional FET being coupled to the second output;

an inverter, the input of the inverter being coupled to the gate of the fifth FET, the output of the inverter being coupled to the gate of the additional FET; and wherein the first and second FETs are complements of the third, fourth, fifth, and additional FETs.

16. A current sense amplifier comprising:

a first FET, the source of the first FET being coupled to a first current input, the drain of the first FET being referred to as a first output;

a second FET, the source of the second FET being coupled to a second current input, the drain of the second FET being referred to as a second output;

a third FET, the sate of the third FET being coupled to the gate of the first FET, the source of the third FET being coupled to the drain of the first FET, the gate of the third FET being coupled to the drain of the second FET;

a fourth FET, the gate of the fourth FET being coupled to the gate of the second FET, the source of the fourth FET being coupled to the drain of the second FET, the gate of the fourth FET being coupled to the drain of the first FET;

a fifth FET, the source of the fifth FET being coupled to the drain of the third and fourth FETs, the drain of the fifth FET being coupled to ground; and an additional FET, the source of the additional FET being coupled to the first output, the drain of the additional FET being coupled to the second output;

wherein the gate of the additional FET is coupled to the gate of the fifth FET; and wherein the first, second and additional FETs are complements of the third, fourth, and fifth FETs.

17. A current sense amplifier comprising:

a first FET, the source of the first FET being coupled to a first current input, the drain of the first FET being referred to as a first output;

a second FET, the source of the second FET being coupled to a second current input, the drain of the second FET being referred to as a second output;

a third FET, the gate of the third FET being coupled to the gate of the first FET, the source of the third FET being coupled to the drain of the first FET, the gate of the third FET being coupled to the drain of the second FET;

a fourth FET, the gate of the fourth FET being coupled to the gate of the second FET, the source of the fourth FET being coupled to the drain of the second FET, the gate of the fourth FET being coupled to the drain of the first FET;

a fifth FET, the source of the fifth FET being coupled to the source of the first FET, the drain of the fifth FET being coupled to the drain of the first FET; and a sixth FET, the source of the sixth FET being coupled to the source of the second FET, the drain of the sixth FET being coupled to the drain of the second FET, the gate of the sixth FET being coupled to the gate of the fifth FET.

18. The current sense amplifier of claim 17; further comprising:

an inverter, the input of the inverter being coupled to the gate of the fifth FET, the output of the inverter being coupled to the drain of the third FET; and wherein the first, second, fifth, and sixth FETs are complements of the third and fourth.

19. The current sense amplifier of claim 17, further comprising:

an additional FET, the gates of the fifth and sixth FETs being coupled together via the source and the drain of the additional FET;

a first inverter, the output of the first inverter being coupled to the drain of the third and fourth FETs;

a second inverter, the output of the second inverter being coupled to the gate of the additional FET, the input of the second inverter being coupled to the input of the first inverter; and wherein the first, second, fifth, and sixth FETs are complements of the third, fourth, and additional FETs.

20. A current sense amplifier comprising:

a first FET, the source of the first FET being coupled to a first current input, the drain of the first FET being referred to as a first output;

a second FET, the source of the second FET being coupled to a second current input, the drain of the second FET being referred to as a second output;

a third FET, the gate of the third FET being coupled to the gate of the first FET, the source of the third FET being coupled to the drain of the first FET, the gate of the third FET being coupled to the drain of the second FET;

a fourth FET, the gate of the fourth FET being coupled to the gate of the second FET, the source of the fourth FET being coupled to the drain of the second FET, the gate of the fourth FET being coupled to the drain of the first FET;

an additional FET, the source of the additional FET being coupled to the drain of the first FET, the drain of the additional FET being coupled to the drain of the second FET;

an inverter, the input of the inverter being coupled to the gate of the additional FET, the output of the inverter being coupled to the drains of the third and fourth FETs; and wherein the first, second, and additional FETs are complements of the second and third FETs.

* * * * *